US012417908B2

(12) United States Patent
Tanaka et al.

(10) Patent No.: US 12,417,908 B2
(45) Date of Patent: Sep. 16, 2025

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Koji Tanaka, Tokyo (JP); Yuji Sato, Tokyo (JP); Yoshihisa Uchida, Tokyo (JP); Shotaro Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 127 days.

(21) Appl. No.: 17/839,048

(22) Filed: Jun. 13, 2022

(65) Prior Publication Data

US 2023/0122575 A1   Apr. 20, 2023

(30) Foreign Application Priority Data

Oct. 13, 2021 (JP) .................. 2021-168314

(51) Int. Cl.
*H01L 21/02* (2006.01)

(52) U.S. Cl.
CPC .. *H01L 21/02175* (2013.01); *H01L 21/02142* (2013.01)

(58) Field of Classification Search
CPC ......... H01L 21/02175; H01L 21/02142; H01L 23/3107; H01L 23/3171; H01L 23/3192; H01L 23/482; H10D 64/232; H10D 12/481; H10D 62/106; H10D 62/109; H10D 64/117
See application file for complete search history.

(56) References Cited

U.S. PATENT DOCUMENTS

| 2003/0070292 | A1* | 4/2003 | Tatoh ..................... H05K 3/108 257/E23.06 |
| 2004/0256730 | A1* | 12/2004 | Hirano .................. H01L 23/485 257/E23.012 |
| 2008/0224315 | A1* | 9/2008 | Miyata .................... H01L 24/84 257/E23.141 |

(Continued)

FOREIGN PATENT DOCUMENTS

| JP | H11-295339 A | 10/1999 |
| JP | 2008-227286 A | 9/2008 |

(Continued)

OTHER PUBLICATIONS

"Notice of Reasons for Refusal" Office Action issued in JP 2021-168314; mailed by the Japanese Patent Office on Jul. 30, 2024.

*Primary Examiner* — Ratisha Mehta
(74) *Attorney, Agent, or Firm* — Studebaker Brackett PLLC

(57) ABSTRACT

According to the present disclosure, a semiconductor device includes a semiconductor substrate, a first metal layer provided above the semiconductor substrate, a second metal layer provided above the first metal layer and containing Ni as a material and a third metal layer provided above the second metal layer and containing Cu or Ni as a material, wherein the second metal layer has a Vickers hardness of 400 Hv or more and is harder than the third metal layer, and the third metal layer is harder than the first metal layer.

20 Claims, 7 Drawing Sheets

(56) References Cited

U.S. PATENT DOCUMENTS

| | | | | |
|---|---|---|---|---|
| 2009/0179215 | A1* | 7/2009 | Matsui | H01L 33/40 257/E21.294 |
| 2010/0252926 | A1* | 10/2010 | Kato | H01L 24/13 257/E23.068 |
| 2015/0043189 | A1* | 2/2015 | Kitazaki | H05K 3/244 29/832 |
| 2016/0111551 | A1* | 4/2016 | Yan | H01L 29/66742 438/479 |
| 2016/0276560 | A1* | 9/2016 | Obata | H01L 33/36 |
| 2018/0053737 | A1 | 2/2018 | Ogawa et al. | |
| 2019/0228974 | A1 | 7/2019 | Soneda et al. | |
| 2019/0363156 | A1* | 11/2019 | Ohara | H10K 59/123 |
| 2020/0273716 | A1 | 8/2020 | Sato et al. | |
| 2020/0303293 | A1* | 9/2020 | Machida | H01L 23/49894 |
| 2021/0028085 | A1* | 1/2021 | Okura | H01L 23/3157 |
| 2021/0152148 | A1* | 5/2021 | Dehara | H03H 9/2457 |
| 2022/0059474 | A1* | 2/2022 | Tanaka | H01L 23/3107 |
| 2022/0077017 | A1* | 3/2022 | Katsuki | H01L 23/04 |

FOREIGN PATENT DOCUMENTS

| | | | |
|---|---|---|---|
| JP | 2017-143214 | A | 8/2017 |
| JP | 2018-037684 | A | 3/2018 |
| JP | 2019-125758 | A | 7/2019 |
| JP | 2019-201160 | A | 11/2019 |
| JP | 6892023 | B1 | 6/2021 |
| WO | 2019/008860 | A1 | 1/2019 |

* cited by examiner

SEMICONDUCTOR DEVICE AND METHOD FOR MANUFACTURING SEMICONDUCTOR DEVICE

BACKGROUND OF THE INVENTION

Field

The present disclosure relates to a semiconductor device and a method for manufacturing the semiconductor device.

Background

JP 2018-37684 A discloses a structure of a surface electrode of a power semiconductor device. The surface electrode is provided with a first Cu layer having a Vickers hardness of 200 to 350 Hv, containing Cu as a main component, and having been formed by electroless plating. A second Cu layer is laminated on the first Cu layer, the second Cu layer being softer than the first Cu layer, having a Vickers hardness of 70 to 150 Hv, containing Cu as a main component, and having been formed by electroless plating. A Cu wire is bonded to the second Cu layer.

In JP 2018-37684 A, for reducing damage to a semiconductor chip at the time of wire bonding, two electroless Cu plating layers are laminated as a surface electrode. Generally, in electroless Cu plating, it is necessary to increase the impurity concentration in order to increase the Vickers hardness. However, when the impurity concentration is increased, there is a possibility that voids due to impurities are generated to make it difficult to increase the Vickers hardness. Therefore, damage to the semiconductor chip may not be reduced sufficiently.

SUMMARY

The present disclosure has been made to solve the problem described above, and it is an object of the present disclosure to provide a semiconductor device and a method for manufacturing the semiconductor device, which can reduce damage to a semiconductor substrate.

The features and advantages of the present disclosure may be summarized as follows.

According to an aspect of the present disclosure, a semiconductor device includes a semiconductor substrate, a first metal layer provided above the semiconductor substrate, a second metal layer provided above the first metal layer and containing Ni as a material and a third metal layer provided above the second metal layer and containing Cu or Ni as a material, wherein the second metal layer has a Vickers hardness of 400 Hv or more and is harder than the third metal layer, and the third metal layer is harder than the first metal layer.

According to an aspect of the present disclosure, a method for manufacturing a semiconductor device includes forming a first metal layer above a semiconductor substrate, forming a second metal layer that contains Ni as a material above the first metal layer by plating, and forming a third metal layer that contains Cu or Ni as a material above the second metal layer, wherein the second metal layer has a Vickers hardness of 400 Hv or more and is harder than the third metal layer, and the third metal layer is harder than the first metal layer.

Other and further objects, features and advantages of the disclosure will appear more fully from the following description.

DESCRIPTION OF EMBODIMENTS

Figure 1:
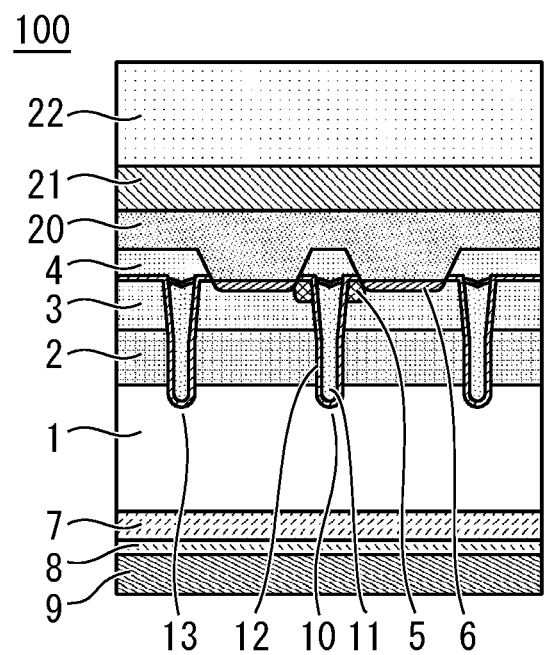
FIG. 1 is a cross-sectional view of a semiconductor device according to a first embodiment.

A semiconductor device and a method for manufacturing the semiconductor device according to each embodiment will be described with reference to the accompanying drawings. Components identical or corresponding to each other are indicated by the same reference characters, and repeated description of them is avoided in some cases.

First Embodiment

FIG. 1 is a cross-sectional view of a semiconductor device 100 according to a first embodiment. The semiconductor device 100 is, for example, a power semiconductor device such as an insulated gate bipolar transistor (IGBT). The semiconductor device 100 includes a semiconductor substrate. In FIG. 1, the semiconductor substrate has a range from the base layer 3 to the collector layer 8.

The semiconductor substrate has a first-conductivity-type drift layer 1 between an upper surface and a back surface opposite to the upper surface. A first-conductivity-type carrier storage layer 2 is provided on the upper surface side of the drift layer 1. A second-conductivity-type base layer 3 is provided on the upper surface side of the carrier storage layer 2. A first-conductivity-type emitter layer 5 and a second-conductivity-type contact layer 6 are provided on the upper surface side of the base layer 3. An active trench 10 and a dummy trench 13 are formed in the semiconductor substrate. The active trench 10 penetrates the emitter layer 5, the base layer 3, and the carrier storage layer 2 from the upper surface of the semiconductor substrate to reach the drift layer 1. A gate electrode 11 is formed on the inner wall of the active trench 10 via a gate insulating film 12.

A buffer layer 7 is provided on the back surface side of the drift layer 1. A second-conductivity-type collector layer 8 is provided on the back surface side of the buffer layer 7. A collector electrode 9 is provided on the back surface of the semiconductor substrate.

A first metal layer 20 is provided on the upper surface of the semiconductor substrate. An interlayer insulating film 4 having an opening for exposing the semiconductor substrate is provided between the semiconductor substrate and the first metal layer 20. The first metal layer 20 is electrically connected to the semiconductor substrate through the opening of the interlayer insulating film 4. The first metal layer 20 is an emitter electrode. A second metal layer 21 is provided on the first metal layer 20.

The second metal layer 21 contains Ni as a material. Ni may be the main component of the second metal layer 21. A third metal layer 22 containing Cu or Ni as a material is provided on the second metal layer. The third metal layer 22 may be mainly composed of Cu. The second metal layer 21 is harder than the third metal layer 22. The third metal layer 22 is harder than the first metal layer 20.

A method for manufacturing the semiconductor device 100 according to the present embodiment will be described. First, each semiconductor layer illustrated in FIG. 1 is formed in the semiconductor substrate. Next, the first metal layer 20 is formed on the semiconductor substrate. Then, the second metal layer 21 is formed on the first metal layer 20 by plating. The second metal layer 21 is formed by, for example, electroless NiP plating. Subsequently, the third metal layer 22 containing Cu or Ni as a material is formed on the second metal layer 21. The third metal layer 22 is formed by, for example, electrolytic Cu plating. Next, the collector electrode 9 is formed on the back surface of the semiconductor substrate. Alternatively, the collector electrode 9 may be formed before the formation of the third metal layer 22. For example, the collector electrode 9 may be formed after the formation of the first metal layer 20, and then the second metal layer 21 may be formed.

A wire or solder is bonded to the third metal layer 22. The semiconductor device 100 is electrically connected to the outside through the wire or solder. In the present embodiment, the hard second metal layer 21 is disposed under the third metal layer 22. This enables a reduction in damage to the semiconductor substrate at the time of wire bonding or solder bonding. Further, the soft first metal layer 20 is disposed under the second metal layer 21. Hence the first metal layer 20 serves as a buffer material, thus enabling a further reduction in damage to the semiconductor substrate. The Vickers hardness of the second metal layer 21 is preferably 400 Hv or more.

The second metal layer 21 may contain P as an impurity. That is, the second metal layer 21 may be an electroless NiP plating layer. At this time, the Vickers hardness of the second metal layer 21 is, for example, 600 to 1300 Hv. By the electroless NiP plating, the Vickers hardness of the second metal layer 21 can be made to be 600 Hv or more even in consideration of variations. It has been confirmed that in the case of adding P to Ni as an impurity, voids do not increase even when the ratio of P is increased. Further, forming the second metal layer 21 by electroless plating can facilitate impurity implantation. Therefore, it is possible to facilitate an increase in Vickers hardness.

The second metal layer 21 may be formed by a method except for the electroless NiP plating when the Vickers hardness can be made to be 400 Hv or more. For example, the second metal layer 21 may be formed by electrolytic Ni plating. Generally, in the electrolytic Ni plating, a Vickers hardness of 200 to 500 Hv is obtained.

When the second metal layer 21 is a plating layer, the Vickers hardness can be increased more than when the second metal layer 21 is a sputtering electrode mainly composed of Ni. Note that the Vickers hardness of an Ni electrode formed by sputtering is generally 100 Hv or less.

The third metal layer 22 is, for example, an electrolytic Cu plating layer. The Vickers hardness of the third metal layer 22 is, for example, 100 to 300 Hv. Generally, impurities are easily mixed in the electroless Cu plating.

Therefore, there is a possibility that voids due to impurities are generated. In contrast, in the electrolytic Cu plating, the mixing of impurities can be reduced, so that the voids in the Cu plating can be reduced. Reducing the voids in the electrode enables improvement in reliability of the heat cycle, power cycle, and the like. Note that the Vickers hardness of the third metal layer 22 on the outermost surface need not be high. There is thus no need to inject large amounts of impurities into the third metal layer 22 by electroless Cu plating. The third metal layer 22 may be formed by electroless Cu plating when the amount of impurities can be adjusted.

Ni may be the main component of the third metal layer 22 when the second metal layer 21 is harder than the third metal layer 22. By making the second metal layer 21 to be a plating layer having high Vickers hardness and mainly composed of Ni, it is possible to facilitate satisfying the relationship that the second metal layer 21 is harder than the third metal layer 22. Hence it is possible to facilitate reducing damage to the semiconductor device 100 at the time of wire bonding.

The structure of the surface electrode of the present embodiment can be applied to a semiconductor device in addition to the IGBT. The semiconductor device 100 may be, for example, a diode, a reverse-conducting (RC)-IGBT, or a metal-oxide-semiconductor field-effect transistor (MOSFET).

The semiconductor substrate may be made with a wide-bandgap semiconductor. The wide-bandgap semiconductor is, for example, silicon carbide, gallium nitride-based material, or diamond. According to the present embodiment, the voids in the electrode can be reduced. Therefore, even when the semiconductor substrate is formed of a wide-bandgap semiconductor and operates at a high temperature, the reliability of the heat cycle can be improved.

These modifications can be appropriately applied to semiconductor devices and methods for manufacturing the semiconductor devices according to embodiments below. Meanwhile, for the semiconductor devices and the methods for manufacturing the semiconductor devices according to the embodiments below, dissimilarities with the first embodiment will mainly be explained as they have many similarities with the first embodiment.

Second Embodiment

Figure 2:
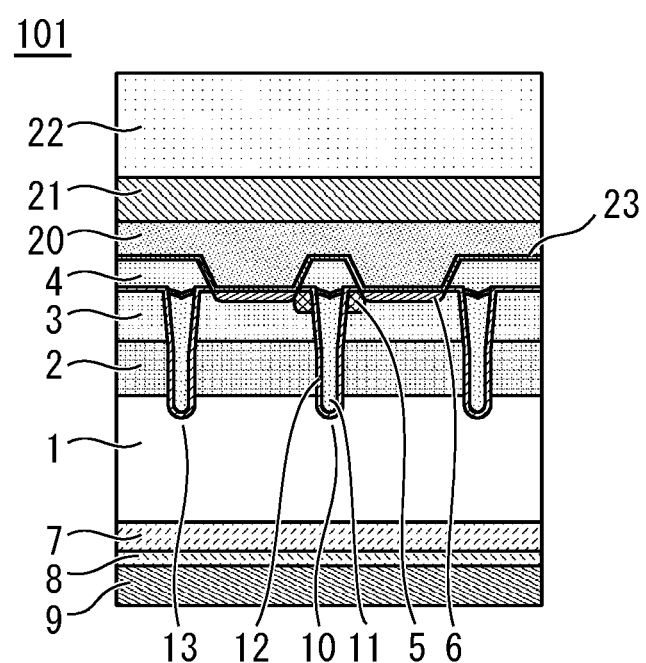
FIG. 2 is a cross-sectional view of a semiconductor device according to a second embodiment.

FIG. 2 is a cross-sectional view of a semiconductor device 101 according to a second embodiment. The structure of the surface electrode of the semiconductor device 101 is different from that of the semiconductor device 100. The other structure is the same as that of the semiconductor device 100. The semiconductor device 101 includes a barrier metal layer 23 provided between the semiconductor substrate and the first metal layer 20. The barrier metal layer 23 is electrically connected to the semiconductor substrate through the opening of the interlayer insulating film 4. The barrier metal layer 23 is harder than the first metal layer 20.

With this configuration, the semiconductor substrate and the surface electrode can be favorably brought into contact with each other, and the electrical characteristics can be stabilized. Further, even when the first metal layer 20 is crushed at the time of wire bonding, damage to the semiconductor substrate can be reduced.

Figure 3:
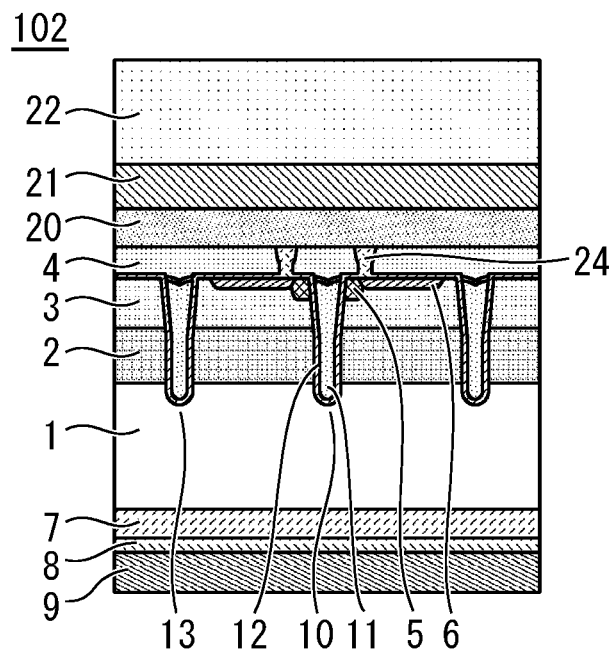
FIG. 3 is a cross-sectional view of a semiconductor device according to a modification of the second embodiment.

FIG. 3 is a cross-sectional view of a semiconductor device 102 according to a modification of the second embodiment. In the semiconductor device 101, the barrier metal layer 23 has been provided on the entire surface of the IGBT cell. Alternatively, as illustrated in FIG. 3, a fourth metal layer 24, which is a buried electrode layer, may be provided in the opening of the interlayer insulating film 4. The fourth metal layer 24 electrically connects the semiconductor substrate and the first metal layer 20. The fourth metal layer 24 is formed of, for example, tungsten.

Third Embodiment

Figure 4:
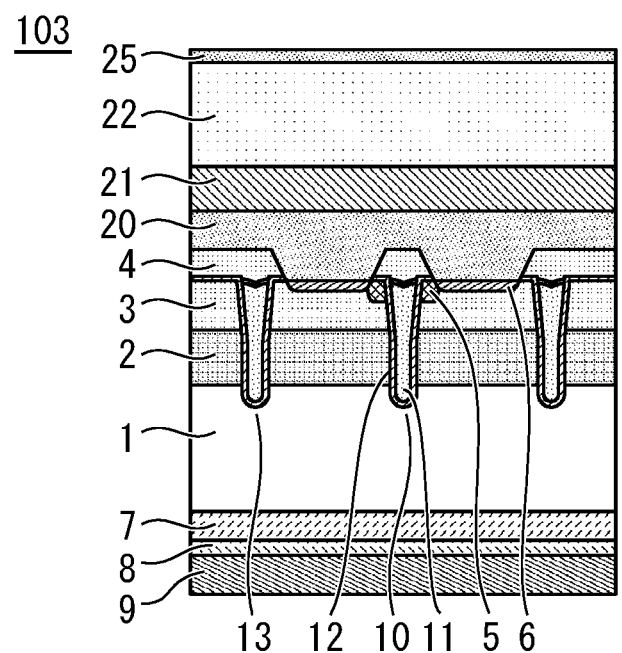
FIG. 4 is a cross-sectional view of a semiconductor device according to a third embodiment.

FIG. 4 is a cross-sectional view of a semiconductor device 103 according to a third embodiment. The semiconductor device 103 is different from the semiconductor device 100 in including an antioxidant film 25 provided on the third metal layer 22. The other structure is the same as that of the semiconductor device 100. For example, a benzotriazole component is used for the antioxidant film 25. In wire bonding or solder bonding, it is desirable to remove the antioxidant film 25 by formic acid reflow or the like.

The surface of the third metal layer 22 mainly composed of Cu is oxidized easily. According to the present embodiment, the oxidation of the third metal layer 22 can be prevented, and the wire bonding property and the solder bonding property can be improved. This makes it possible to perform wire bonding or solder bonding without applying excessive energy to the semiconductor device 103. Thus, damage to the semiconductor substrate can be reduced.

Figure 5:
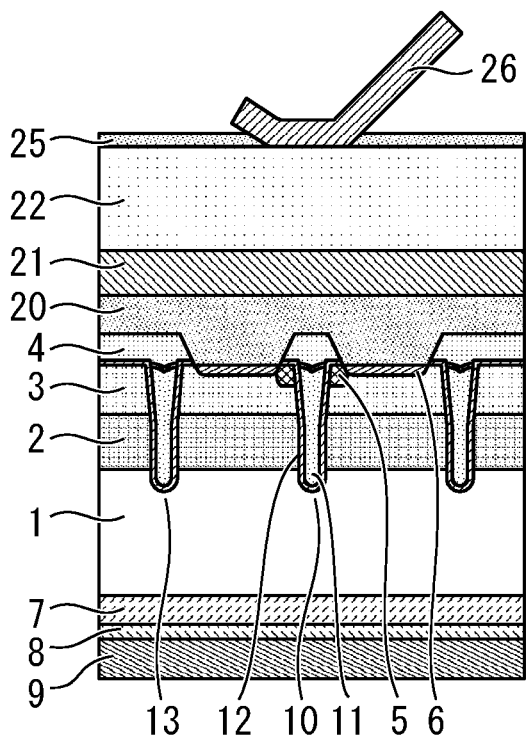
FIG. 5 is a cross-sectional view of a semiconductor device according to a modification of the third embodiment.

FIG. 5 is a cross-sectional view of a semiconductor device 104 according to a modification of the third embodiment. In the semiconductor device 104, a wire 26 penetrates the antioxidant film 25 and is electrically connected to the third metal layer 22. The wire 26 contains Cu as a material, for example. When the antioxidant film 25 is a thin film, the wire may be bonded penetrating the antioxidant film 25 while the antioxidant film 25 remains unremoved. This can eliminate the need for a step of reducing a chip such as formic acid reflow, thereby cutting the process cost.

Fourth Embodiment

Figure 6:
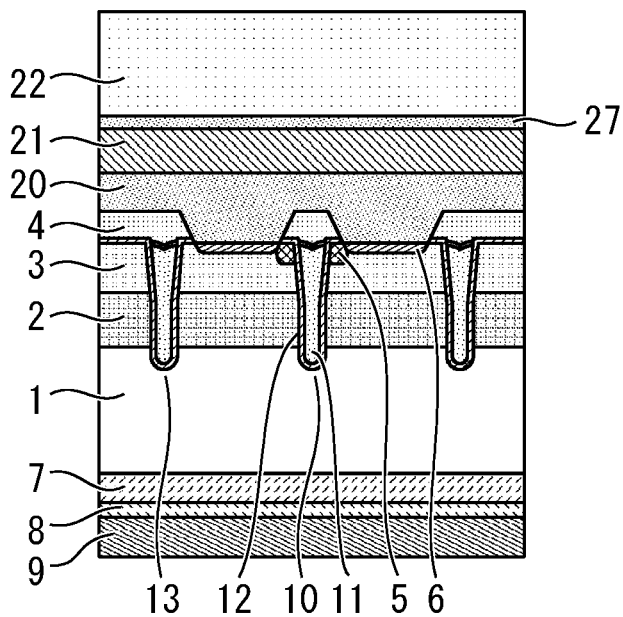
FIG. 6 is a cross-sectional view of a semiconductor device according to a fourth embodiment.

FIG. 6 is a cross-sectional view of a semiconductor device 105 according to a fourth embodiment. The semiconductor device 105 includes an adhesion layer 27, which brings the second metal layer 21 and the third metal layer 22 into close contact with each other, between the second metal layer 21 and the third metal layer 22. The other structure is the same as that of the semiconductor device 100. The adhesion layer 27 is formed of, for example, Ti, TiW, W, Ta, TaN, or Mo. The adhesion layer 27 is formed by, for example, physical vapor deposition (PVD) or chemical vapor deposition (CVD).

According to the present embodiment, with the second metal layer 21 and the third metal layer 22 adhering to each other, the energy of wire bonding can be transmitted efficiently. Therefore, the bonding is possible without applying excessive energy to the semiconductor substrate, and damage to the semiconductor substrate can be reduced.

Instead of the adhesion layer 27, an Au layer may be provided between the second metal layer 21 and the third metal layer 22. The second metal layer 21 is mainly composed of Ni and is thus easily oxidized in the manufacturing process. The Au layer can prevent the oxidation of the second metal layer 21. Accordingly, variations in the electrical characteristics of the surface electrode can be prevented.

Fifth Embodiment

Figure 7:
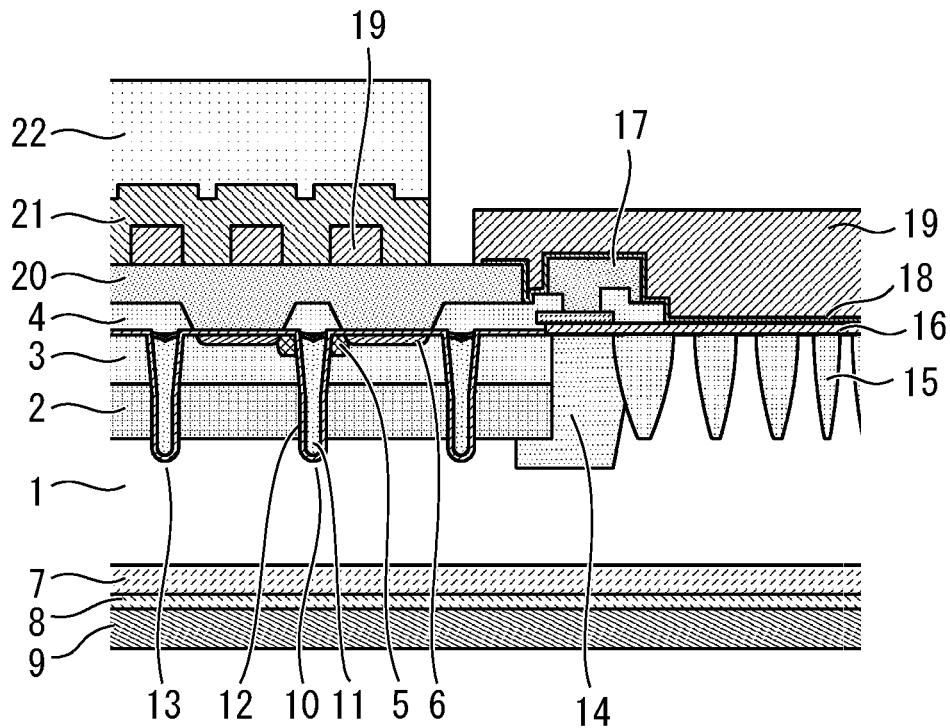
FIG. 7 is a cross-sectional view of a semiconductor device according to a fifth embodiment.

FIG. 7 is a cross-sectional view of a semiconductor device 106 according to a fifth embodiment. The semiconductor device 106 includes a second-conductivity-type well region 14 at a boundary between a cell region and a termination region. A reduced surface field (RESURF) region 15 is provided on the upper surface side of the termination region. A gate wiring 17 is provided on the well region 14. A field oxide film 16 is provided on the RESURF region 15. A first protective film 18 is formed so as to cover the field oxide film 16 and the gate wiring 17. A second protective film 19 is formed on the upper surface of the first protective film 18.

The second protective film 19 is provided on a part of the upper surface of the first metal layer 20 in the cell region and covered with the second metal layer 21. The second protective film 19 is, for example, a resin layer. Due to the heat insulation effect of the second protective film 19, heat transfer to the first metal layer 20 at the time of wire bonding can be prevented. Therefore, the first metal layer 20 can be prevented from being crushed.

Figure 8:
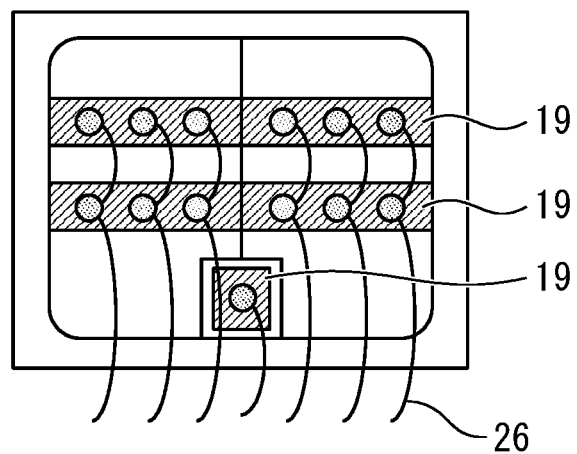
FIG. 8 is a plan view of a semiconductor device according to a modification of the fifth embodiment.

The second protective film 19 is disposed, for example, over the entire cell region. The placement of the second protective film 19 is not limited thereto. FIG. 8 is a plan view of a semiconductor device 106a according to a modification of the fifth embodiment. The second protective film 19 may be provided only directly below the region subjected to wire bonding.

Sixth Embodiment

Figure 9:
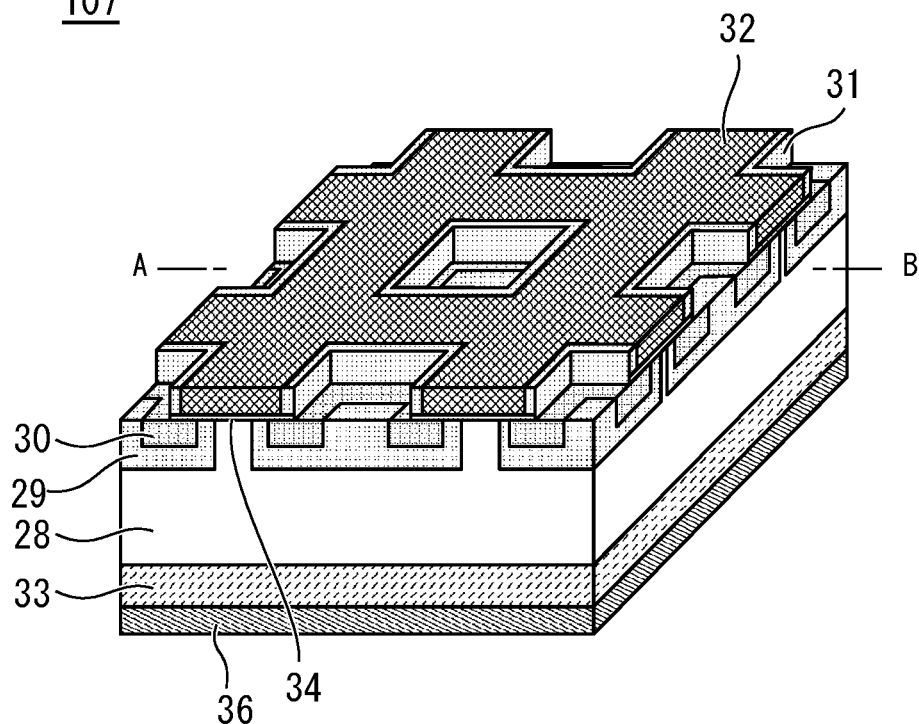
FIG. 9 is a perspective view of a semiconductor device according to a sixth embodiment.
Figure 10:
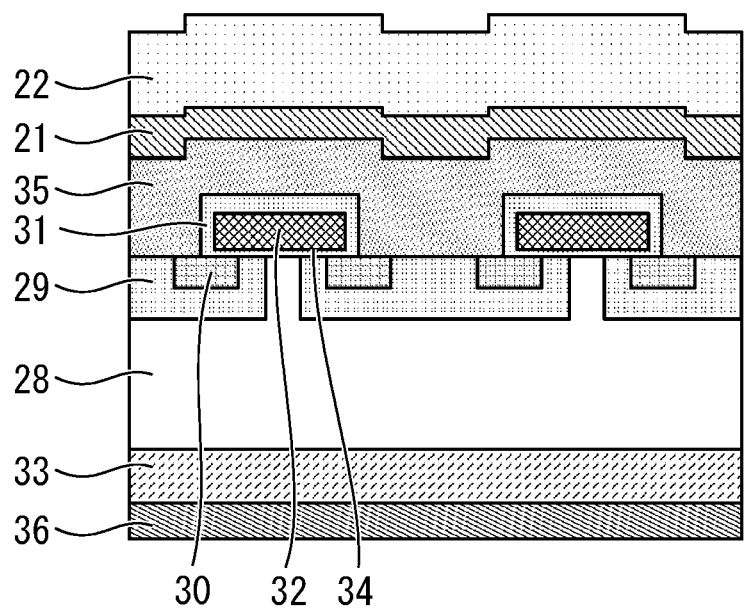
FIG. 10 is a cross-sectional view taken along a line A-B of FIG. 9.

FIG. 9 is a perspective view of a semiconductor device 107 according to a sixth embodiment. FIG. 10 is a cross-sectional view taken along a line A-B of FIG. 9. In FIG. 9, the first metal layer, the second metal layer, and the third metal layer are omitted. The semiconductor device 107 is a MOSFET. In the semiconductor device 107, a first-conductivity-type epitaxial layer 28 is provided on the upper surface side of a first-conductivity-type semiconductor substrate 33. A second-conductivity-type well layer 29 is provided on the upper surface side of the epitaxial layer 28. A first-conductivity-type source layer 30 is partially disposed in the well layer 29.

An interlayer insulating film 31 partially opened is provided on the upper surface of the epitaxial layer 28. A gate electrode 32 and a gate insulating film 34 disposed between the gate electrode 32 and the upper surface of the epitaxial layer 28 are provided in the interlayer insulating film 31.

A plurality of openings are formed in the interlayer insulating film 31 in a dot shape in a plan view. The first metal layer 35 is electrically connected to the source layer 30 through a plurality of openings of the interlayer insulating film 31. The first metal layer 35 is a source electrode. A second metal layer 21, which is a plating layer mainly composed of Ni, is provided on the upper surface of the first metal layer 35. A third metal layer 22, which is a plating layer mainly composed of Cu, is disposed on the upper surface of the second metal layer 21. As in the first embodiment, the second metal layer 21, the third metal layer 22, and the first metal layer 35 are formed in decreasing order in hardness.

Unevenness is formed on the upper surface of the third metal layer 22 so as to correspond to the openings of the interlayer insulating film 31. This minute unevenness improves the bonding property of the wire or solder. It is thus possible to perform the bonding without applying excessive energy to the semiconductor device 107, and to reduce damage to the semiconductor substrate.

The openings of the interlayer insulating film 31 are not limited to the dot shape but may be a lattice shape.

Seventh Embodiment

Figure 11:
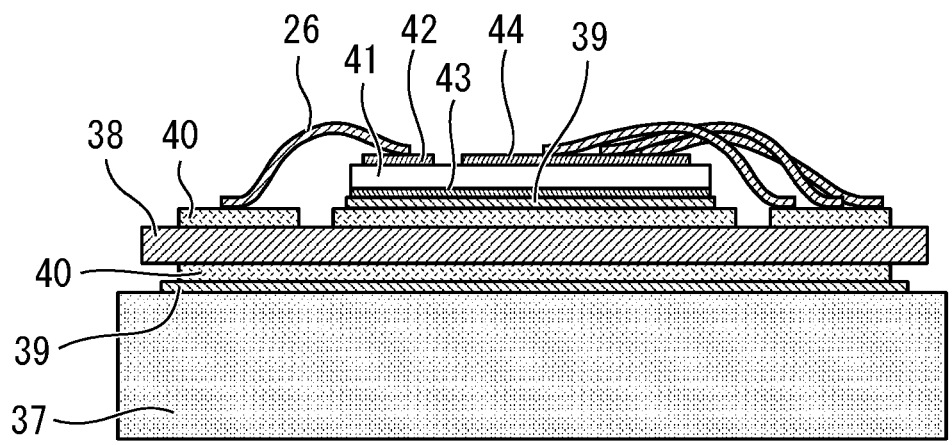
FIG. 11 is a cross-sectional view of a semiconductor device according to a seventh embodiment.

FIG. 11 is a cross-sectional view of a semiconductor device 108 according to a seventh embodiment. The semiconductor device 108 includes a base plate 37. A ceramic substrate 38 having an electrode pad 40 is bonded to the upper surface of the base plate 37 by solder 39. A semiconductor chip 41 is bonded to the upper surface of the ceramic substrate 38 by the solder 39. The semiconductor chip 41 has a collector pad 43 on the back surface and a gate pad 42 and an emitter pad 44 on the upper surface.

Each of the gate pad 42 and the emitter pad 44 is formed of the first metal layer, the second metal layer, and the third metal layer described in the first to sixth embodiments. The wire 26 is electrically connected to the third metal layer. The wire 26 contains Cu, for example, as a material. The wire 26 may be mainly composed of Cu. The electrode pad 40 is mainly composed of Cu, for example. The gate pad 42 and the emitter pad 44 are connected to the electrode pad 40 through the wire 26.

In general, Cu bonding is stronger than Al bonding. Therefore, the use of the Cu bonding can improve the resistance to the power cycle. Note that the ceramic substrate 38 and the semiconductor chip 41 may be bonded not only by the solder 39 but also by an Ag or Cu sinter material.

Eighth Embodiment

Figure 12:
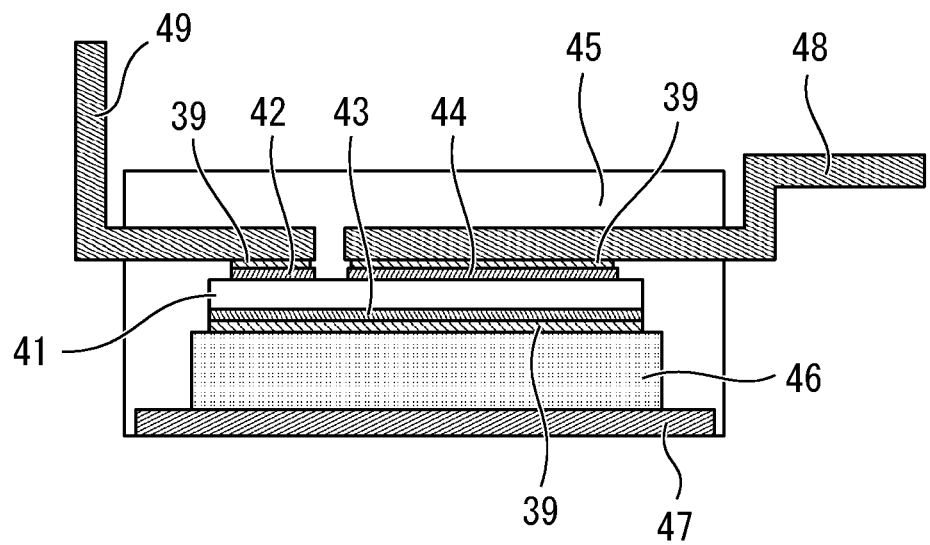
FIG. 12 is a cross-sectional view of a semiconductor device according to an eighth embodiment.

FIG. 12 is a cross-sectional view of a semiconductor device 109 according to an eighth embodiment. The semiconductor device 109 is, for example, an IGBT module. The semiconductor device 109 includes an insulating sheet 47, a heat spreader 46 provided on the upper surface of the insulating sheet 47, and a semiconductor chip 41 bonded to the upper surface of the heat spreader by solder 39. The semiconductor chip 41 has a collector pad 43 on the lower surface and a gate pad 42 and an emitter pad 44 on the upper surface.

Each of the gate pad 42 and the emitter pad 44 is formed of the first metal layer, the second metal layer, and the third metal layer described in the first to sixth embodiments. In the present embodiment, the solder 39 is provided on the third metal layer. A lead frame 48, which is a main terminal, is bonded to the emitter pad 44 by the solder 39. A lead frame 49, which is a control terminal, is bonded to the gate pad 42 by the solder 39. A mold resin 45 is provided so as to expose a part of each of the lead frames 48, 49 and cover the semiconductor chip 41.

By the solder bonding, damage to the semiconductor chip 41 can be reduced more than wire bonding. Further, the heat radiation performance of the semiconductor chip 41 can be improved, and the current density can be increased.

Therefore, the semiconductor device 109 can be reduced in size.

Ninth Embodiment

Figure 13:
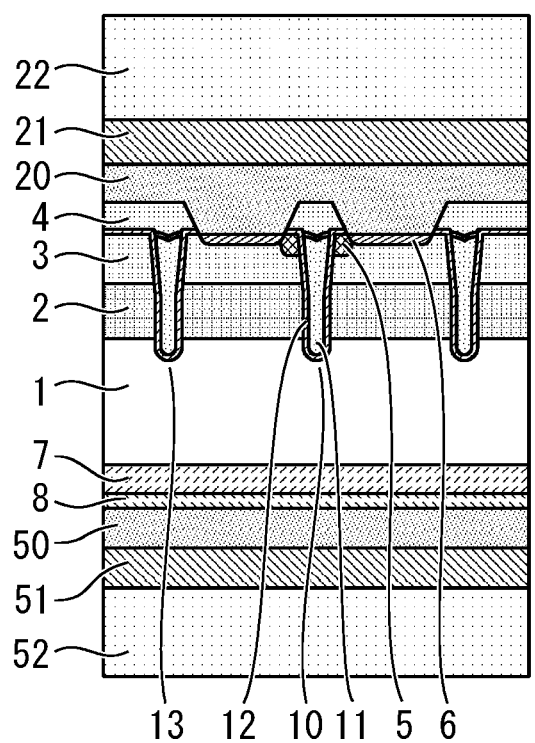
FIG. 13 is a cross-sectional view of a semiconductor device according to a ninth embodiment.

FIG. 13 is a cross-sectional view of a semiconductor device 110 according to a ninth embodiment. The semiconductor device 110 is different from the semiconductor device 100 in that three metal layers are also formed on the back surface side of the semiconductor substrate. The other structure is the same as that of the semiconductor device 100. The semiconductor device 110 includes a fifth metal layer 50 provided under a semiconductor substrate, a sixth metal layer 51 provided under the fifth metal layer 50 and containing Ni as a material; and a seventh metal layer 52 provided under the sixth metal layer 51 and containing Cu or Ni as a material. The Vickers hardness of the sixth metal layer 51 is 400 Hv or more. The sixth metal layer 51 is harder than the seventh metal layer 52, and the seventh metal layer 52 is harder than the fifth metal layer 50.

The fifth metal layer 50 is a collector electrode. The sixth metal layer 51 is a plating layer. Ni may be the main component of the sixth metal layer 51. The seventh metal layer 52 is, for example, a plating layer. The seventh metal layer 52 may be mainly composed of Cu.

With such a structure of the back electrode, heat radiation performance can be improved, and current density can be improved. Hence the device can be reduced in size. In addition, stresses in the plurality of metal layers cancel each other out, thus enabling a reduction in the warpage of the chip. Therefore, void defects on the back surface can be reduced.

Meanwhile, technical features explained in each embodiment may be appropriately combined to use.

In the semiconductor device and the method for manufacturing the semiconductor device according to the present disclosure, the hard second metal layer can reduce damage to the semiconductor substrate due to wire bonding or the like.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-168314, filed on Oct. 13, 2021 including specification, claims, drawings and summary, on which the Convention priority of the present application is based, are incorporated herein by reference in its entirety.

The invention claimed is:

1. A semiconductor device comprising:
   a semiconductor substrate;
   a first metal layer provided above the semiconductor substrate;
   a second metal layer provided above the first metal layer and containing Ni as a material; and
   a third metal layer provided above the second metal layer and containing Cu or Ni as a material, wherein
   the second metal layer has a Vickers hardness of 400 Hv or more and is harder than the third metal layer,
   the third metal layer is harder than the first metal layer, and
   the second metal layer directly contacts the first metal layer.

2. The semiconductor device according to claim 1, wherein the second metal layer contains P as an impurity.

3. The semiconductor device according to claim 1, further comprising a barrier metal layer provided between the semiconductor substrate and the first metal layer,
   wherein the barrier metal layer is harder than the first metal layer.

4. The semiconductor device according to claim 1, further comprising an insulating film provided between the semiconductor substrate and the first metal layer and having an opening formed to expose the semiconductor substrate,
   wherein the first metal layer is electrically connected to the semiconductor substrate through the opening.

5. The semiconductor device according to claim 4, further comprising a fourth metal layer that is provided in the opening and electrically connects the semiconductor substrate and the first metal layer.

6. The semiconductor device according to claim 4, wherein a plurality of the openings are formed in the insulating film in a dot shape in a plan view.

7. The semiconductor device according to claim 6, wherein unevenness is formed on an upper surface of the third metal layer.

8. The semiconductor device according to claim 1, further comprising an adhesion layer that brings the second metal layer and the third metal layer into close contact with each other.

9. The semiconductor device according to claim 1, further comprising an Au layer provided between the second metal layer and the third metal layer.

10. A semiconductor device comprising:
a semiconductor substrate;
a first metal layer provided above the semiconductor substrate;
a second metal layer provided above the first metal layer and containing Ni as a material;
a third metal layer provided above the second metal layer and containing Cu or Ni as a material; and
a resin layer provided on a part of an upper surface of the first metal layer and covered with the second metal layer, wherein
the second metal layer has a Vickers hardness of 400 Hv or more and is harder than the third metal layer, and
the third metal layer is harder than the first metal layer.

11. The semiconductor device according to claim 10, wherein the resin layer is provided immediately below a region subjected to wire bonding.

12. The semiconductor device according to claim 1, further comprising an antioxidant film provided above the third metal layer.

13. The semiconductor device according to claim 12, further comprising a wire that penetrates the antioxidant film and is electrically connected to the third metal layer.

14. The semiconductor device of claim 13, wherein the wire contains Cu as a material.

15. The semiconductor device according to claim 1, further comprising a wire electrically connected to the third metal layer and containing Cu as the material.

16. The semiconductor device according to claim 1, further comprising solder provided above the third metal layer.

17. The semiconductor device according to claim 1, further comprising
a fifth metal layer provided under the semiconductor substrate;
a sixth metal layer provided under the fifth metal layer and containing Ni as a material; and
a seventh metal layer provided under the sixth metal layer and containing Cu or Ni as a material,
wherein the sixth metal layer has a Vickers hardness of 400 Hv or more and is harder than the seventh metal layer, and
the seventh metal layer is harder than the fifth metal layer.

18. The semiconductor device according to claim 1, wherein the semiconductor substrate is made with a wide band gap semiconductor.

19. The semiconductor device according to claim 18, wherein the wide band gap semiconductor is silicon carbide, gallium-nitride-based material or diamond.

20. A method for manufacturing a semiconductor device, the method comprising:
forming a first metal layer above a semiconductor substrate;
forming a second metal layer that contains Ni as a material above the first metal layer by plating; and
forming a third metal layer that contains Cu or Ni as a material above the second metal layer, wherein
the second metal layer has a Vickers hardness of 400 Hv or more and is harder than the third metal layer,
the third metal layer is harder than the first metal layer, and
the second metal layer directly contacts the first metal layer.

* * * * *